(12) United States Patent
Sanders

(10) Patent No.: US 6,567,653 B1
(45) Date of Patent: May 20, 2003

(54) DUAL-MODE COMMUNICATIONS TRANSMITTER

(75) Inventor: Stuart Baker Sanders, Apex, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/548,307

(22) Filed: Apr. 12, 2000

(51) Int. Cl.⁷ .............................. H04B 1/04; H04B 7/216
(52) U.S. Cl. ....................... 455/126; 455/436; 455/553; 455/127; 455/93; 370/335; 370/145; 330/295
(58) Field of Search .............................. 455/126, 89, 80, 455/437, 127, 436, 93, 553; 330/295, 51, 126, 133; 370/276, 296, 350, 335, 342

(56) References Cited

U.S. PATENT DOCUMENTS

| | | | |
|---|---|---|---|
| 5,175,872 A | * 12/1992 | Borras | 455/426 |
| 5,251,331 A | 10/1993 | Schwent et al. | |
| 5,432,473 A | * 7/1995 | Mattila et al. | 330/133 |
| 5,530,923 A | * 6/1996 | Heinonen et al. | 330/295 |
| 5,673,287 A | 9/1997 | Colvis et al. | |
| 5,689,817 A | 11/1997 | Fok | |
| 5,722,063 A | * 2/1998 | Peterzell et al. | 455/13.4 |
| 6,061,338 A | * 5/2000 | O | 370/335 |
| 6,091,966 A | * 7/2000 | Meadows | 330/124 R |
| 6,115,585 A | * 9/2000 | Matero et al. | 333/101 |
| 6,298,244 B1 | * 10/2001 | Boesch et al. | 330/126 |

FOREIGN PATENT DOCUMENTS

EP 0675605 A2 10/1995

\* cited by examiner

Primary Examiner—Vivian Chin
Assistant Examiner—Kamran Afshar
(74) Attorney, Agent, or Firm—Coats & Bennett P.L.L.C.

(57) ABSTRACT

Power amplifier mode control and an associated switching arrangement permit a wireless communications device, such as a mobile terminal, to advantageously use the same transmitter power amplifier in both digital and analog operating modes. Analog mode requires the mobile terminal to operate its receiver and transmitter in full-duplex mode, thus requiring a duplexer for separating the receive signal from the transmit signal. Digital mode requires the mobile terminal to operate its receiver and transmitter in half-duplex mode, eliminating the need for the duplexer. In a basic implementation, the mobile terminal includes a switching arrangement allowing the duplexer to be switched in and out of the power amplifier transmit path. For reasons of signal requirements and operating efficiency, the mobile terminal adjusts the operating point of the power amplifier such that it operates linearly or quasi-linearly when in the mobile terminal is in digital mode. When in analog mode, the mobile terminal switches in the duplexer and adjusts the operating point of the power amplifier such that it operates non-linearly (saturated). Because the power output increase of the power amplifier in changing from digital mode to analog mode essentially matches the power loss increase of switching in the duplexer, the overall power output of the mobile terminal remains substantially the same.

19 Claims, 7 Drawing Sheets

DUAL-MODE COMMUNICATIONS TRANSMITTER

BACKGROUND OF THE INVENTION

The present invention is related to wireless communications systems and, in particular, to the use of a common transmit amplifier for both analog and digital transmissions.

When consumer-oriented wireless communications systems first appeared, underlying communications signaling was based on analog transmission schemes. North America, and the United States in particular, adopted an analog cellular wireless communications standard referred to as the Advanced Mobile Phone System (AMPS), embodied in the EIA/TIA-553 standard. While service area coverage was initially sparse in the early days of mobile terminal use, enthusiastic consumer adoption of mobile communications technology allowed service providers to build an extensive network of AMPS-based communication cells. Presently, most populous areas, and even many outlying areas, of the United States enjoy essentially continuous AMPS-based mobile communications service coverage.

As the underlying technologies evolved, however, communications service providers began offering enhanced communications services based on newer, digital communication standards. Examples of such standards include 800 MHz Code Division Multiple Access (CDMA) digital cellular as embodied in the EIA/TIA-95 standard, and 800 MHz Time Division Multiple Access (TDMA) digital cellular as embodied in the TIA/EIA-136 standard. Note that the 800 MHz versions of TIA/EIA-136 are sometimes referred to as digital AMPS, or D-AMPS. Digital-mode mobile terminals typically offer users enhanced features and convenience. For example, digital-mode mobile terminals typically consume less power than their analog counterparts, thereby providing extended battery life. Moreover, digitally based transmission standards can offer enhanced voice quality, greater call security, and better noise immunity. Other advantages potentially offered by the newer digital communication standards include various text-messaging services, and other data-oriented communications.

Understandably then, consumer preference has shifted away from analog-based systems in favor of the convenience and services associated with digital cellular services. One potential drawback for consumers not living in relatively dense population centers is that deployment of digital communications services has not yet reached the level of proliferation associated with the older analog (e.g., AMPS) systems. Thus, there are yet many geographic areas where only analog wireless communications service is available. Although digital coverage areas will eventually equal or exceed those of analog, mobile terminals capable of operating in either type of system offer consumers considerable advantage and convenience. For example, many people use mobile terminals as a matter of security when traveling. As many areas between cities are covered only by analog systems, having analog-compatibility represents a key capability for ensuring the ability to call for assistance if necessary.

Thus, designers typically include both analog and digital communications system compatibility in current mobile terminals, with such terminals commonly referred to as dual-mode mobile terminals. In North American markets, it is particularly common for mobile terminal to incorporate AMPS capability, along with digital cellular capability. However, the flexibility attendant with this design choice is not without penalty. For example, TIA/EIA-136 digital transmissions include both phase and amplitude modulations and thus require linear amplification. AMPS transmissions, on the other hand, are frequency modulation based and are essentially amplitude independent. Because AMPS transmit and receive operations are simultaneous (full-duplex), transmit amplifiers are on continuously. Thus, transmit amplifier operating efficiency is critical to achieving acceptable mobile terminal battery life for analog operation. Since the DC operating efficiency of an amplifier in non-linear saturated mode exceeds that of linear mode operation, AMPS-based mobile terminals typically do not use linear transmit signal amplification. Further, non-linear transmit signal amplification is permissible in AMPS because the transmission signaling scheme is amplitude independent.

Therefore, designers are left to choose between two unattractive propositions: include two separate transmit amplifiers in the mobile terminal, one biased for digital-mode operation and one biased for analog-mode operation; or include only one transmit amplifier biased for digital-mode operation and accept the attendant analog-mode operating inefficiency. Thus, there remains a need for a dual-mode mobile terminal that benefits from the economic advantages gained by using a single transmit amplifier for both analog and digital operations, but that does not suffer analog-mode operating inefficiencies.

SUMMARY OF THE INVENTION

The present invention includes methods and apparatus allowing a mobile communications terminal to advantageously use the same power amplifier for both digital and analog transmissions. Many mobile terminals are required to operate in newer, digital communications networks where such service is available, yet still maintain compatibility with older, analog communications networks. Operating efficiency concerns associated with using the same power amplifier for both analog and digital transmissions are addressed in the present invention by including provisions for linear (or quasi-linear) operation of the power amplifier when the mobile terminal is in digital mode, and for non-linear (saturated) operation of the power amplifier when the mobile terminal is in analog mode. In some embodiments, an advantageous operating-point control circuit allows the mobile terminal to set the transmit amplifier's operating point. Further, a switching arrangement may allow the mobile terminal to select full- or half-duplex operation, such that digital transmit signals bypass an included duplexer, while analog transmit signals are routed through the duplexer.

In exemplary embodiments, the present invention provides gain control for the transmit amplifier's input drive signal. Thus, the mobile terminal may adjust the drive level of the transmit power amplifier such that it operates in linear (or quasi-linear) mode when desired—such as in digital mode—and operates in a fully saturated mode when desired—such as in analog mode. Further, exemplary embodiments of present invention include a controllable switching arrangement permitting the mobile terminal to select various transmit and receive paths, based on current digital- or analog-mode operation. Output signals associated with a control unit within the mobile terminal provide for this operating-point control and transmit/receive path selection.

By including an exemplary embodiment of the present invention, a mobile terminal may use the same power amplifier for both digital and analog transmissions without sacrificing efficiency or signal fidelity in either mode. Further, some optional embodiments of the present invention incorporate provisions for combining basic analog and digital mode operation with alternate-band digital operation. With such embodiments, the mobile terminal may operate on different frequency bands while in digital mode, or change modes to operate within an analog communications system.

DETAILED DESCRIPTION OF THE INVENTION

Figure 1:
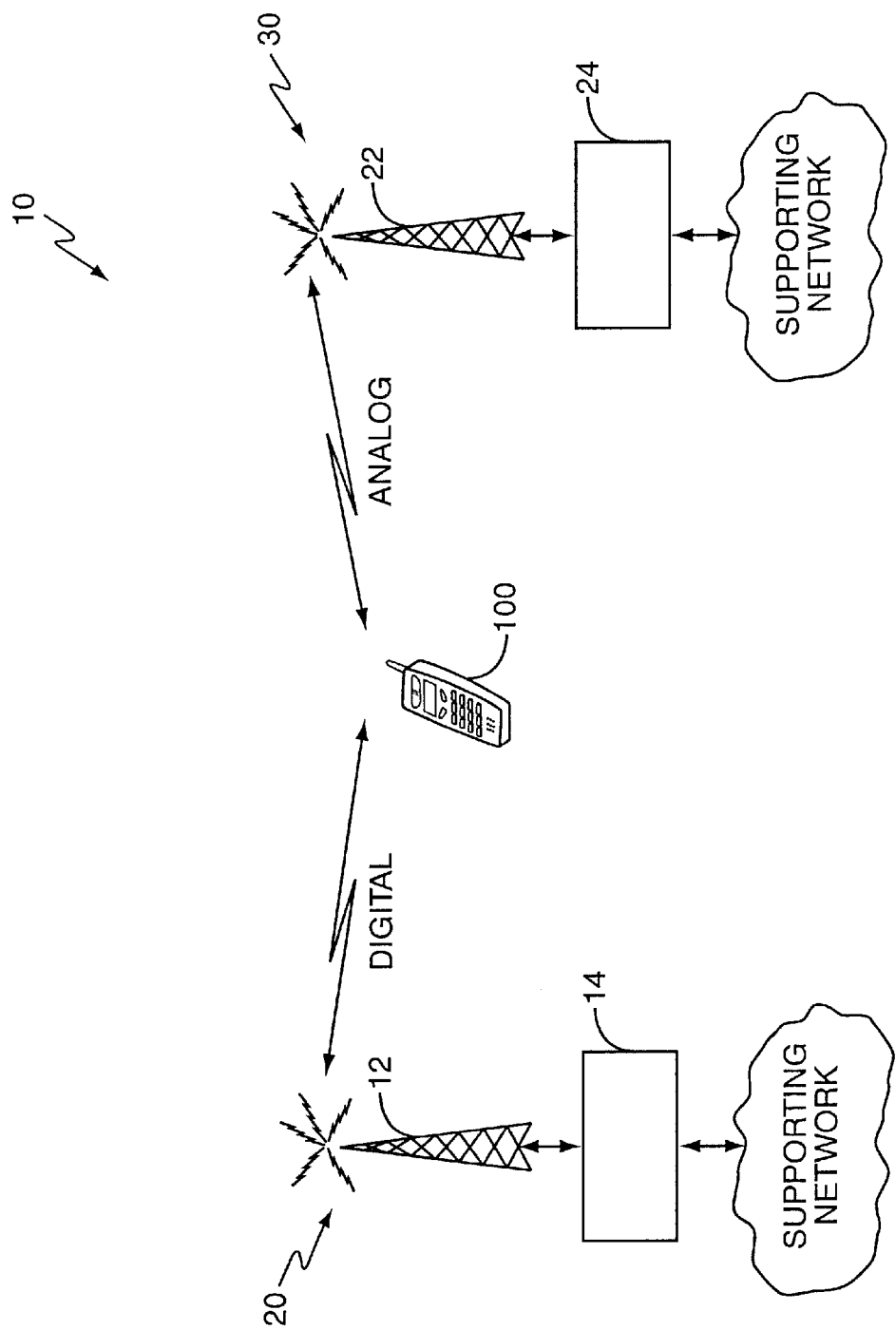
FIG. 1 shows an exemplary communication system in which the present invention may be advantageously practiced.

FIG. 1 illustrates an exemplary communications system 10 in which the present invention may be advantageously practiced. FIG. 1 depicts a digital wireless communications system 20 and an analog wireless communications system 30, as well as an exemplary mobile terminal 100. While FIG. 1 shows digital communications system 20 with one communications tower 12 and associated base station 14 for simplicity, the actual digital communications system 20 may actually comprise a plurality of communication towers 12 and associated base stations 14. Likewise, the analog communications system 30 may comprise a plurality of communications towers 22 and associated base stations 24. In actual use, certain communications system resources, such a communications towers 12.22, may be shared between digital system 20 and analog system 30.

A user operating mobile terminal 100 may communicate with users of other mobile terminals 100, or with users on other communications networks, such as the Public Switched Telephone Network (PSTN), using either digital communications system 20 or analog communications system 30. Note that both digital communications system 20 and analog communications system 30 may comprise additional, supporting network components, but these are not shown for simplicity.

When communicating with digital communications system 20, mobile terminal 100 operates in a digital mode, and when communicating with analog communications system 30, mobile terminal 100 operates in an analog mode. More particular differences regarding digital mode and analog mode operation are explained later herein.

Figure 2:
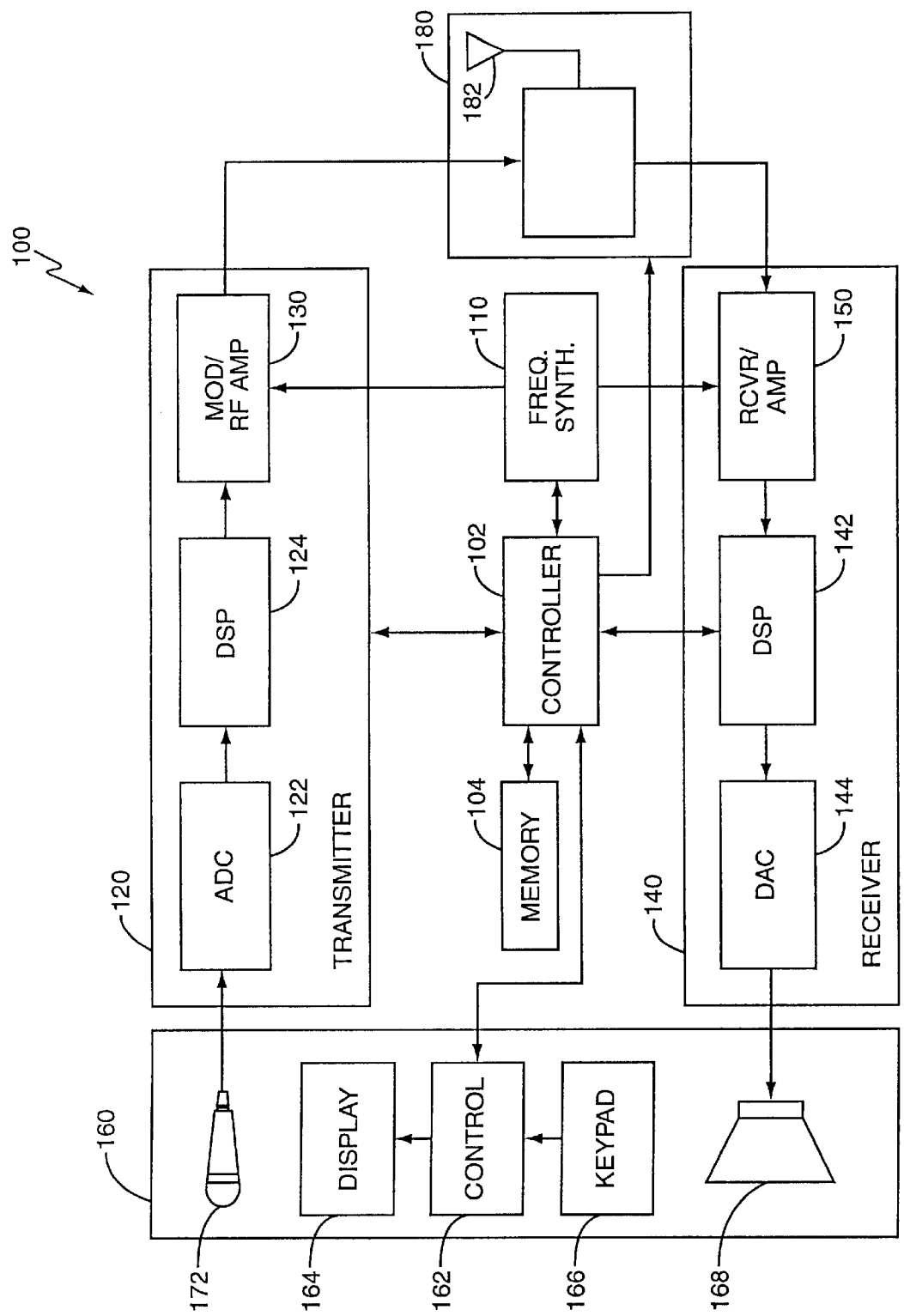
FIG. 2 show a block diagram of one embodiment of a mobile terminal according to the present invention.

FIG. 2 illustrates an exemplary embodiment for the mobile terminal 100 of FIG. 1. The mobile terminal 100 includes a controller 102 and supporting memory 104, an operator interface 160, a transmitter 120, a receiver 140, a frequency synthesizer 110, and an antenna assembly 180. Functional and architectural details related to the mobile terminal 100 of FIG. 2 provide a basis for understanding the present invention, but should not be construed as limiting. Indeed, mobile terminal design admits tremendous variation and the present invention may be practiced in a broad range of implementations for mobile terminal 100.

The operator interface 160 typically includes a display 164, a keypad 166, a microphone 172, a speaker 168, and an interface controller 162. The display 164 allows an operator to dial digits, monitor call status, and view other service information. The keypad 166 allows the operator to dial numbers, enter commands, and select various options. The interface controller 162 interfaces the display 164 and keypad 166 with controller 102. The microphone 172 receives acoustic signals (speech) from the user and typically converts them to analog, electrical signals. A speaker 168 converts analog electrical signals from the receiver 140 to acoustic signals that can be heard by the user.

The analog electrical signals from the microphone 172 are supplied to the transmitter 120. The transmitter 120 includes an analog to digital converter (ADC) 122, a digital signal processor (DSP) 124, and a modulator/RF amplifier 130. The ADC 122 converts analog electrical signals from the microphone 172 into corresponding digital signals, which are forwarded to DSP 124. In cooperation with the controller 102, the DSP 124 processes the digital signals received from the ADC 122 to a form suitable for processing by modulator/RF amplifier 130. The DSP 124 includes a speech coder and channel coder (not shown) for processing the digitized speech signals to prepare them for transmission. The speech coder compresses the digital signal and the channel coder inserts error detection, error correction, and signaling information in accordance with requirements of the particular mobile communications system 10 in which the mobile terminal 100 is used. The modulator/RF amplifier 130 converts the output from the DSP 124 into a signal suitable for transmission by the antenna assembly 180.

The receiver 140 includes a receiver/amplifier 150, a DSP 142, and a digital-to-analog converter (DAC) 144. Signals received through the antenna assembly 180 are passed to the receiver/amplifier 150, which shifts the frequency spectrum of the received RF signals and amplifies them to a level appropriate for subsequent processing by the DSP 142. The DSP 142 typically includes an equalizer to compensate for phase and amplitude distortions in the channel-corrupted signal, a demodulator for extracting bit sequences from the received signal, and a detector for determining transmitted bits based on the extracted sequences. A channel decoder checks for channel errors in the received signal. The channel decoder includes logic for separating control and signaling data from speech data. Control and signaling data passes to the controller 102 while speech data passes to a speech decoder (not shown) for processing. Processed speech data then passes to the DAC 144 for conversion to an analog speech signal. The analog speech signal drives the speaker 168 to produce an audible output (e.g., voice sounds).

The controller 102 coordinates the operation of the transmitter 120 and the receiver 140, and may, for instance, take the form of a typical microprocessor. Coordination of the receiver 140 and transmitter 120 may include coordinating power control, channel selection, and timing, as well as a host of other functions known in the art. In an exemplary embodiment of the present invention, the controller 102 provides, either directly or indirectly, digital/analog mode control for transmitter/modulator 130 and antenna assembly 180. Controller 102 may be a dedicated or shared microprocessor, a single processor or multiple, parallel processors, as needed or desired. The controller 102 inserts signaling messages into the transmitted signals and extracts signaling messages from the received signals. The controller 102 responds to any base station commands contained in the extracted signaling messages, including uplink and downlink channel reassignments, and implements user commands. When the user enters commands via the keypad 166, interface controller 162 transfers them to the controller 102 for action. Memory 104 stores and supplies information at the direction of the controller 102 and preferably includes both volatile and nonvolatile storage. Memory 104 may include stored program code and operating data for use by the controller 102.

Frequency synthesizer 110 generates signals used by the receiver 140 and transmitter 120 respectively to tune to assigned uplink and downlink communication frequencies. The receiver 140 uses signals output from frequency synthesizer 110 to downconvert received signals. The downconverted signal is filtered and processed to extract transmitted information. The transmitter 120 uses signals output from frequency synthesizer 110 to derive the carrier frequency which is modulated to form a transmit signal which is transmitted via antenna assembly 180.

Figure 3:
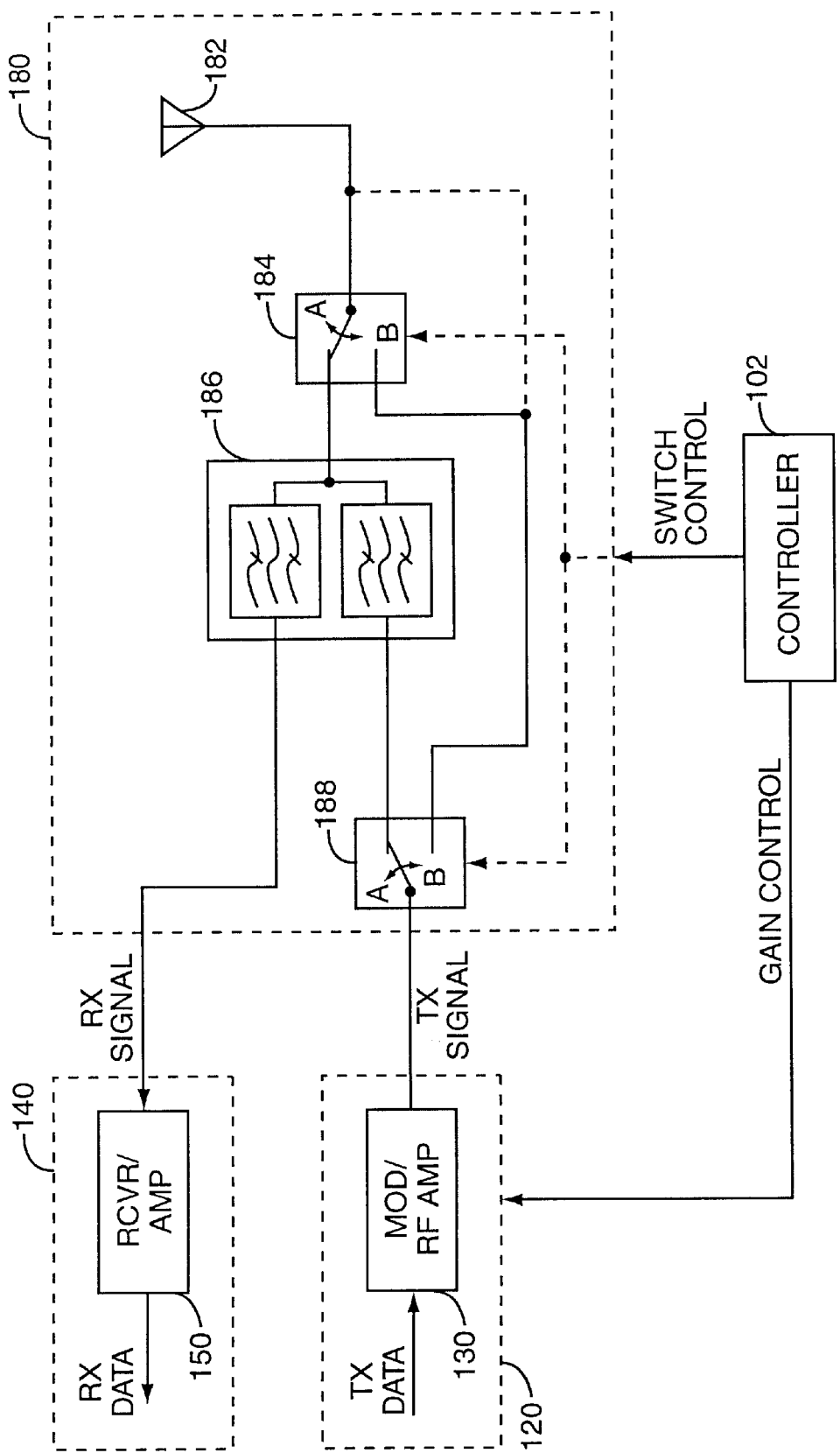
FIG. 3 shows one embodiment of an antenna assembly according to the present invention showing full/half duplex receive and transmit circuits and control.

FIG. 3 illustrates the receiver 140 and transmitter 120 interconnected with antenna assembly 180. Antenna assembly 180 includes an antenna 182, a first path selection switch 184, a second path selection switch 188, and a duplexer 186. Selection switches 184,188 may be thought of as configuration switches for the antenna assembly 180 that allow the mobile terminal 100 to select different receive/transmit signal paths, as will be explained in more detail below. Duplexer 186 functions as a pair of bandpass filters, one for transmit frequencies and one for receive frequencies, such that transmit signals do not interfere with simultaneous receive signals, when the mobile terminal configures antenna assembly 180 for full-duplex operation. Radio-frequency signals received through antenna 182 pass through an intermittently or continuously enabled (depending on operating mode) receive path for input to receiver 140. Radio-frequency signals are output from transmitter 120 and pass through a selectable transmit path to antenna 182, where they are radiated outward. Controller 102 cooperates with transmitter 120 and antenna assembly 180 to set transmitter operating mode (digital or analog) and to select the corresponding analog or digital receive and transmit paths.

When operating in digital communications system 20, mobile terminal 100 configures antenna assembly 180 for half-duplex operation. Controller 102 directly or indirectly sets both selection switches 188,184 to their B contacts during transmit operations, and sets switch 188 to contact B and switch 184 to contact A during receive operations. Controller 102 directly or indirectly sets transmitter 120 such that transmit signal amplification is substantially linear, as is required in digital operation. Thus, when mobile terminal 100 is transmitting in digital mode, the transmit signal output from transmitter 120 passes through switch 188 to switch 184, thereby bypassing duplexer 186.

A dashed line from contact B of switch 184 to the common contact of switch 184 indicates an optional, permanent signal bypass of switch 184. Bypassing switch 184 may be desirable to minimize switch insertion losses in the digital transmit path. However, such bypassing leaves contact B of switch 188 in permanent connection with antenna 182. In full-duplex operation (analog mode), the mobile terminal 100 simultaneously transmits and receives, so this connection may be problematic unless switch 188 is chosen with adequate signal isolation in mind. The intrinsic signal isolation offered between receive and transmit channels in duplexer 186 provides a useful reference in determining required signal isolation for switch 188 in such configurations. A typical duplexer 186 provides approximately 35 dB of stop-band isolation for the received signal.

When operating in analog communications system 30, mobile terminal 100 configures antenna assembly 180 for full-duplex operation. Controller 102 directly or indirectly sets selection switches 188,184 to contacts A, and preferably maintains them in this position for the duration of analog-mode operation. This configuration allows duplexer 186 to pass transmit signals from transmitter 120 to antenna 182, while simultaneously passing receive signals from antenna 182 to receiver 140. As previously noted, duplexer 186 provides bandpass filtering such that transmit signal energy is substantially eliminated from the received signal input to receiver 140. In analog mode, controller 102 directly or indirectly controls transmitter 120 such that its transmit signal amplification is substantially nonlinear (saturated).

Figure 4:
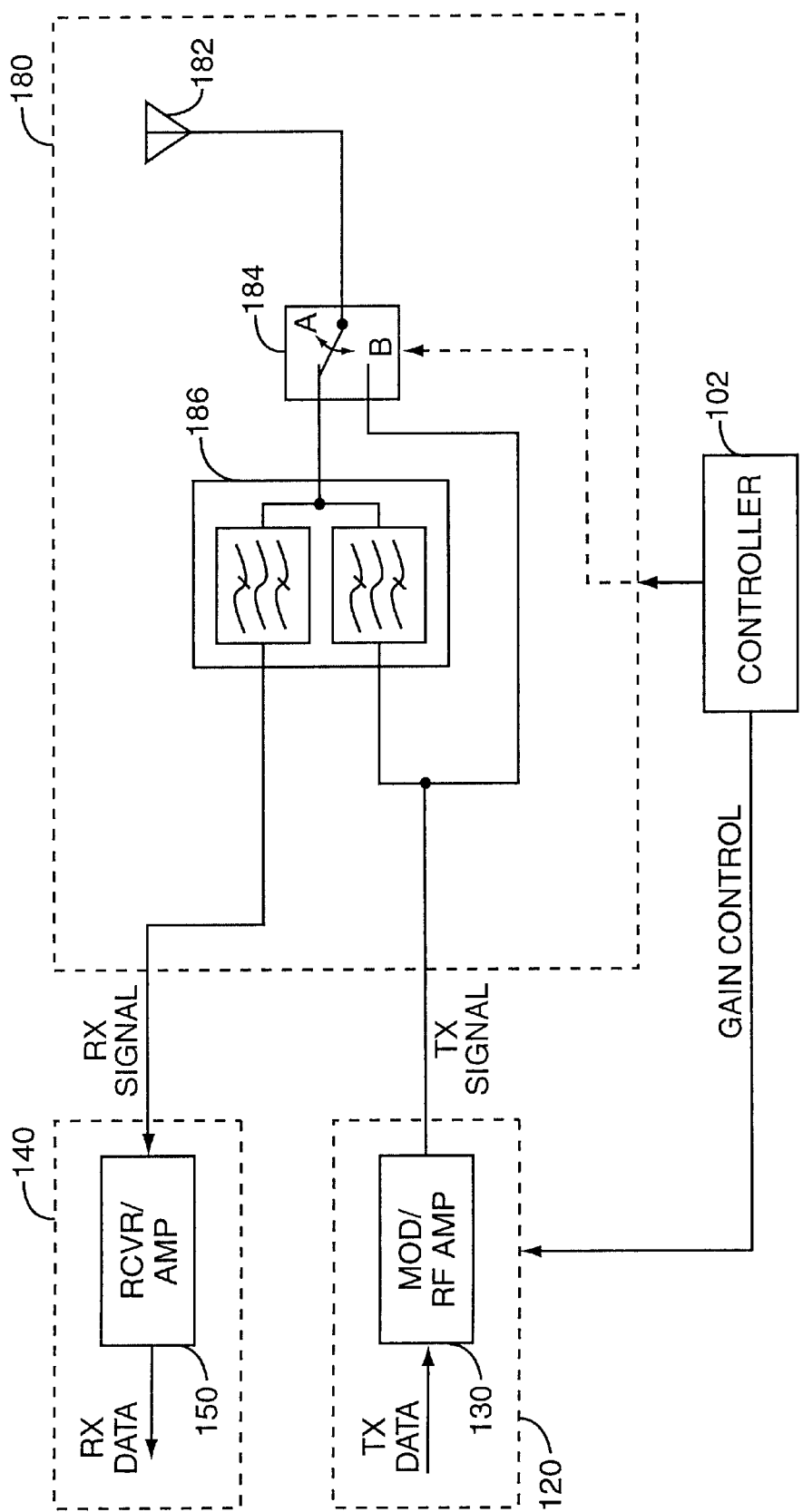
FIG. 4 shows another embodiment of an antenna assembly according to the present invention with reduced full/half duplex switching components as compared to FIG. 3.

FIG. 4 illustrates a variation on the exemplary embodiment shown in FIG. 3. Like FIG. 3, controller 102 determines half- or full-duplex operation of antenna assembly 180 by controlling an associated switching arrangement. However, the embodiment illustrated in FIG. 4 gains economic and manufacturing advantage through elimination of switch 188. In half-duplex operation, controller 102 sets switch 184 to contact B during transmit operations and to contact A during receive operations. In full-duplex operation, controller 102 sets switch 184 to contact A. Operating point control of transmit amplifier 240 (see FIG. 6) is consistent with that described for FIG. 3.

An understanding conventional digital and analog transmission schemes may be helpful in understanding the advantages obtained by controlling transmitter 120 to operate either linearly or nonlinearly in digital and analog modes, respectively. An exemplary digital wireless communications standard, TIA/EIA-136, calls for transmitting signals using a form of Quadrature Phase Shift Keying—the specific form used is $\pi/4$ Differential Quadrature Phase Shift Keying (DQPSK). In general, QPSK signaling conveys information via the transmit signal using both phase and amplitude modulation. Thus, transmitter amplification must be linear, or substantially linear, in order to properly transmit the amplitude modulations. In contrast, AMPS—the dominant North American analog wireless communication standard—uses an analog transmission scheme wherein frequency modulation (FM) signaling conveys the transmitted information. Because AMPS-based receivers are not sensitive to fluctuations in the amplitude of received signals, transmit signal amplification may be substantially non-linear. While such nonlinear operation cannot be tolerated in digital mode, the intrinsically better efficiency of nonlinear amplification makes nonlinear amplification attractive for analog-mode operations. Indeed, because the transmitter 120 and receiver 140 are in simultaneous use during analog-mode operations of the mobile terminal 100, increased efficiency associated with transmitter 120 is particularly important.

Figure 5:
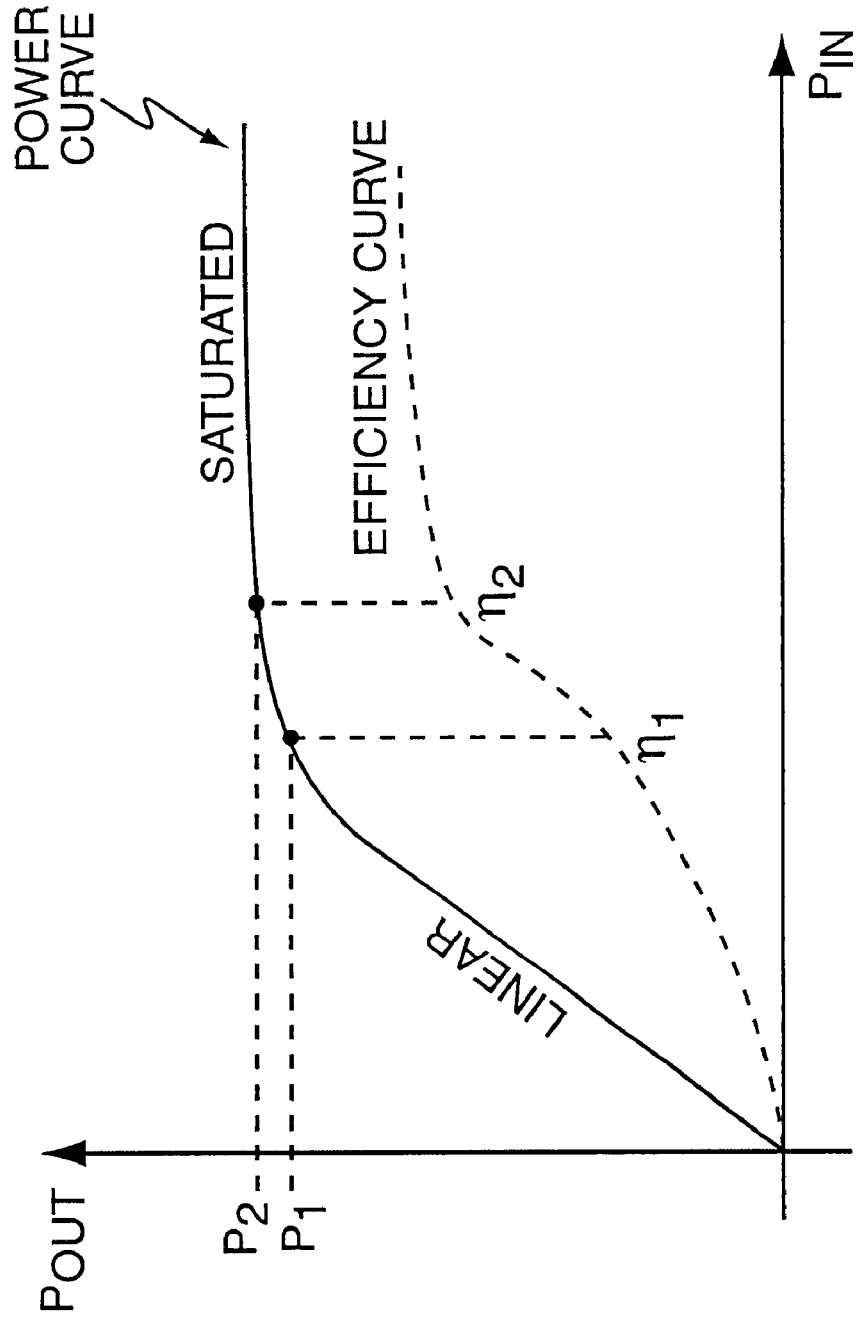
FIG. 5 depicts a transmit amplifier operating curve and related efficiency curve for a typical transmit amplifier as may be used in the present invention.

FIG. 5 illustrates a typical amplifier-operating curve. The power curve illustrated in FIG. 5 depicts amplified signal power as a function of amplifier input power. A dashed-line efficiency curve corresponds with the power curve and illustrates amplifier efficiency in relation to amplifier operating point. Initial inspection of the diagram reveals that, up to a certain point, amplifier efficiency increases as the operating point moves through the linear range of operation into the nonlinear (saturated) range of operation. In an exemplary embodiment of the present invention, transmitter 120 includes a transmit amplifier 240—shown in FIG. 6—operated at point $P_1$ on the amplifier-operating curve when the mobile terminal 100 is in digital mode and operated at point $P_2$ when the mobile terminal 100 is in analog mode.

It is well known in the art to establish point $P_1$ at or near the 1 dB compression point on the operating curve of transmit amplifier 240. The 1 dB compression point refers to the point on the operating curve at which the output power is 1 dB down from what would be expected with purely linear amplification. Also, the 1 dB point reflects the maximum output power that may be obtained from transmit amplifier 240 before its amplification becomes substantially non-linear. Note the corresponding efficiency, $\eta_1$, is typically in the range of forty percent. However, in digital-mode operation, the transmitter 120 is active approximately ⅓ of the time on average, so the relatively inefficient operating point required for digital signal transmission is not a significant penalty.

In contrast, in analog mode operations, the mobile terminal 100 simultaneously uses both transmitter 120 and receiver 140. Because transmitter 120 is continuously on, operating efficiency for transmitter 120 is critical. As earlier noted, the present invention adjusts the point of operation for transmit amplifier 240 to point $P_2$ when mobile terminal 100 operates in analog mode. As illustrated, point $P_2$ corresponds to a fully saturated operating point and is 2–3 dB (nominally 2.5 dB) past the operating point for digital-mode operation. Operating efficiency increases significantly to point $\eta_2$ on the efficiency curve, with efficiencies typically in the range of fifty-five to sixty percent. Output power from transmit amplifier 240 also increases a corresponding amount when moving beyond the 1 dB compression operating point.

Because AMPS transmission signals are based on FM, operating the transmit amplifier 240 in fully saturated fashion does not interfere with signal transmissions. Points $P_1$ and $P_2$ illustrate that transmit amplifier output power increases between digital and analog modes of operation. However, for the embodiment of FIG. 3, the digital-mode transmit path bypasses duplexer 186, while the analog-mode transmit path passes through duplexer 186. As the power loss for an exemplary duplexer 186 essentially matches the increase in output power between points $P_1$ and $P_2$, the actual transmit power level for mobile terminal 100 can remain essentially the same for both digital and analog modes of operation.

Figure 6:
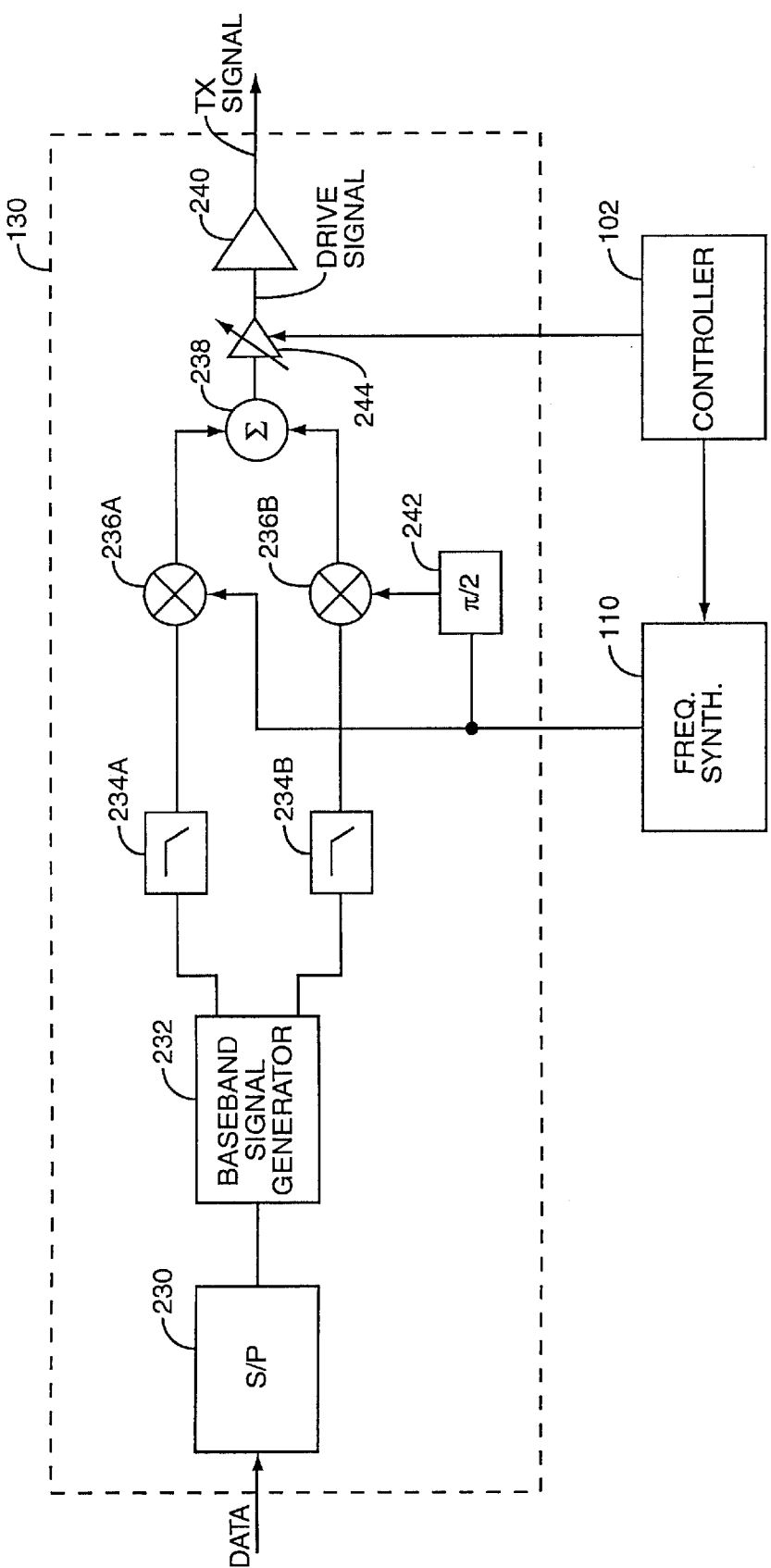
FIG. 6 shows exemplary details for the modulator/RF amplifier of FIG. 2.

FIG. 6 illustrates the modulator/RF amplifier 130 of transmitter 120 in more detail. Particularly, FIG. 6 illustrates an exemplary embodiment for transmit amplifier 120 having amplifier mode control. Moreover, the details illustrated in FIGS. 3, 4, and 6 accompanying the foregoing discussion depict exemplary mobile terminal architectures based on the assumption that dual-mode operation entails operating in essentially the same frequency bands (e.g., nominally in the 800 MHz band for both analog and digital cellular operation). As the present invention may be practiced without this limitation, FIG. 6 should not be construed as limiting the scope of the present invention. Rather, it should be understood that transmitter implementation details depend upon specific operation requirements and may deviate from that depicted in this example.

Modulator/RF amplifier 130 includes a serial-to-parallel converter (S/P) 230, a baseband signal generator 232, low-pass filters 234A/234B, modulators 236A/236B, a summer 238, adjustable-gain amplifier 244, and transmit amplifier 240. Digital data from the DSP 124 is input to S/P 230. The baseband signal generator 232 converts the parallel data output from S/P 230 into baseband sinusoidal signal outputs, one output signal formed as a cosine representation of the input data and one output signal formed as a sine representation of the input data. These two baseband signals are used to modulate an RF carrier signal derived from the frequency synthesizer 110. The outputs from modulators 236A and 236B are combined in summer 238 for input to RF amplifier 240. Note that modulator 236B is driven by a carrier signal 90° out of phase with respect to modulator 236A using a $\pi/2$ phase shifter 242 to effect the desired quadrature carrier signal transmission.

The combined signal output from summer 238 passes through the adjustable-gain amplifier 244. A transmit amplifier drive signal, output by adjustable-gain amplifier 244, serves as an input to transmit amplifier 240. Assuming a fixed gain of $A_1$ for transmit amplifier 240, its output signal will be $A_1x$, where x represents the input drive signal output from adjustable-gain amplifier 244. Thus, if the maximum amplitude of x is such that the amplitude of $A_1x$ remains within the linear (or substantially) linear operation range of transmit amplifier 240, the transmit signal output from transmit amplifier 240 will have a linear relationship to its input drive signal. By increasing the gain of amplifier 244, the amplitude of x may be increased such that $A_1x$ exceeds the linear output capability of transmit amplifier 240, thus driving it into saturation. Thus, by varying the signal level input into transmit amplifier 240, its operating mode may be controlled. Therefore, controller 102 controls the gain of adjustable-gain amplifier 244 such that transmit amplifier 240 amplifies the drive signal in a substantially linear (linear or quasi-linear) fashion for digital-mode operation. For analog mode operation, controller 102 controls the adjustable-gain amplifier 244 such that the transmit amplifier 240 amplifies the drive signal in a substantially non-linear fashion (saturated region operation).

Note that the foregoing technique of controlling transmit amplifier 240 represents an exemplary method, but should not be construed as limiting in any way. Indeed, substantial opportunity exists for varying the bias (operating) point of transmit amplifier 240. For example, the input drive signal x may have a fixed gain associated with it, while the gain $A_1$ of transmit amplifier 240 is varied. Techniques for varying gain $A_1$ include but are not limited to configurable gain-setting feedback networks (such as selectively switched feedback elements). These and other techniques are well understood in the art.

Figure 7:
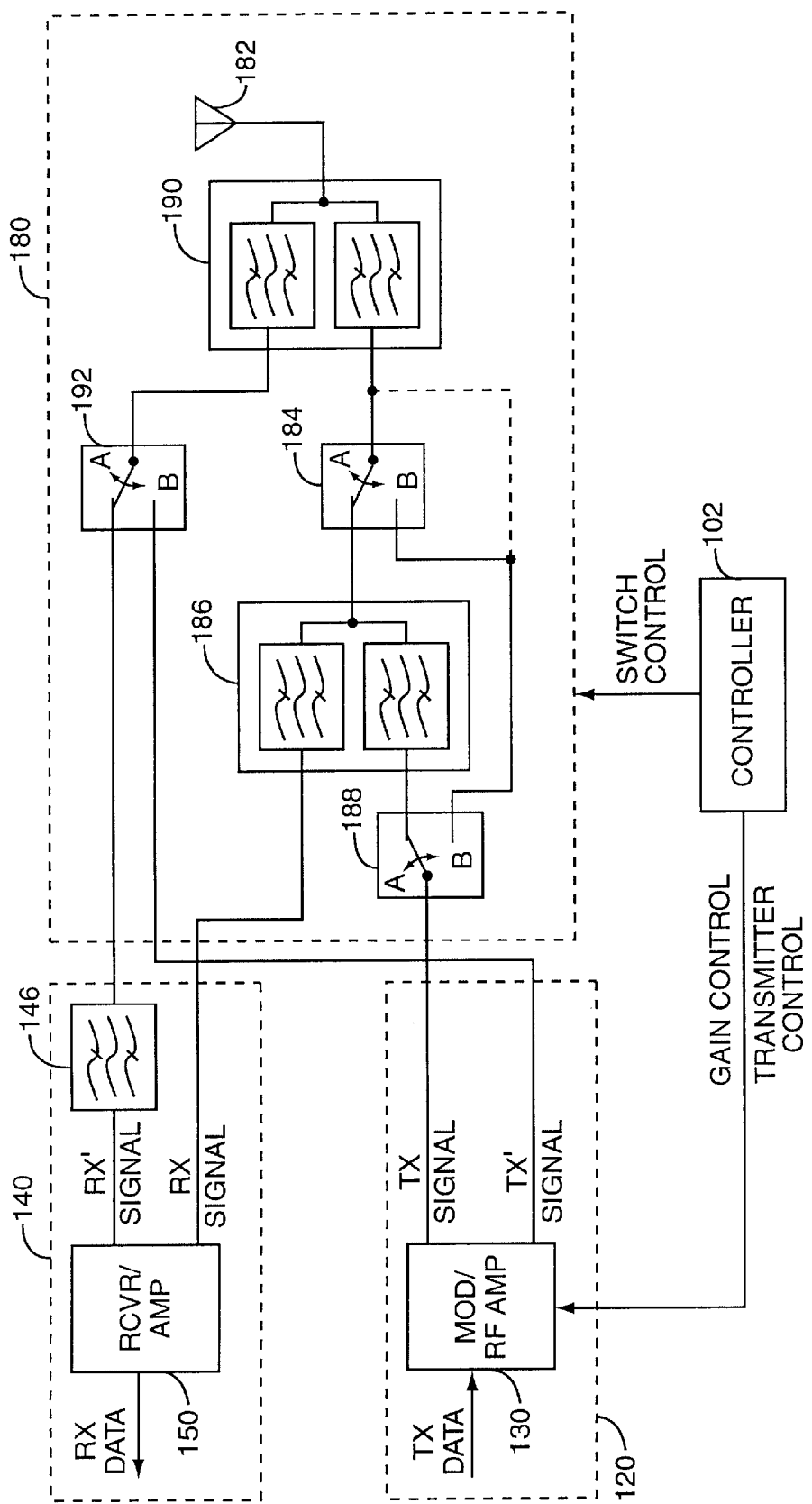
FIG. 7 shows another alternative embodiment of the present invention with dual-mode/dual-band capabilities.

FIG. 7 illustrates an alternate, exemplary embodiment of the present invention. As earlier explained, mobile terminals 100 provide users added convenience by including both digital and analog modes of operation. However, TIA/EIA-136 discussed earlier represents only one in a number of competing digital systems. Examples of alternate digital communications systems include the primarily European Global System for Mobile communications (GSM) standard, as well as 1900 MHz versions of the TIA/EIA-136 standard, known generally as Personal Communications Services (PCS). For added flexibility and consumer convenience, some mobile terminals 100 incorporate not only dual-mode (digital and analog) capabilities, but so-called dual-band capabilities as well. As is well known in the art, referring to a mobile terminal 100 as a dual-band terminal implies that it selectively operates in at least two frequency bands, such as in both the 800 MHz band defined by TIA/EIA-136, as well as the 1900 MHz band defined by GSM or PCS. Power control of transmit amplifier 240 and full/half-duplex switching arrangements included in the present invention may be adapted for a mobile terminal 100 having dual-mode/dual-band capabilities.

The embodiment of FIG. 7 adds dual-band capability to FIG. 3's basic dual-mode capability. In FIG. 7, labels TX and RX represent respectively the same transmit and receive signals illustrated in FIG. 3. Transmitter 130 includes an additional transmitter output signal, labeled TX' and receiver 140 further includes an additional receiver input signal labeled RX'. TX' derives from an additional transmit amplifier included in transmitter 130 that operates on a frequency band associated with the alternate digital service. Likewise, receiver 140 includes a separate receive signal path for the RX' signal. Note the switch 192 provides for half-duplex operation when the mobile terminal 100 is operating in the alternate-band digital mode. Additionally, antenna assembly 180 adds a diplexer 190 disposed between switch 184 and antenna 182. Functionally, diplexer 190 isolates 1900 MHz signals from the 800 MHz receive/transmit paths. The RX' signal path may include additional filtering, as exemplified by filter 146. When mobile terminal 100 operates in the 800 MHz band, controller 120 operates switches 188,184 based on analog or digital mode operation as previously explained. When mobile terminal 100 operates in the 1900 MHz band, controller 120 controls operation of switch 192 for half-duplex receive/transmit operations.

Foregoing illustrations provide a basis for understanding the present invention. However, these illustrations depict exemplary embodiments only to aid such understanding, rather than to suggest any limitation regarding actual implementation. Indeed, the present invention advantageously varies the amplification characteristics for transmitter 120 based on whether mobile terminal 100 operates in digital or analog modes, and makes corresponding receive/transmit path selections to support half-duplex digital mode and full-duplex analog mode transmit and receive operations. Tremendous flexibility exists in terms of how such functionality may be incorporated into a mobile terminal 100. For example, the number, type, and positioning of receive/transmit path selection switches is not critical to practicing the present invention. Rather, any arrangement compatible with the radio-frequency signals involved, and one that provides selective transmit bypassing of the duplexer 186, is well within the scope and spirit of the present invention.

The foregoing specification describes operating point adjustment based on amplifier drive signal gain control, yet this represents only an exemplary approach. Any technique for establishing linear (quasi linear) and non-linear (saturated) operating points for transmit amplifier 240 (or transmitter 120 generally) is considered within the scope and spirit of the present invention. The present embodiments are, therefore, to be considered in all respects as illustrative and not restrictive, and all changes coming within the meaning and equivalency range of the appended claims are intended to be embraced therein.

What is claimed is:

1. A method of operating a mobile terminal having at least a digital mode of operation and an analog mode of operation, said method comprising:

operating a transmit amplifier included in said mobile terminal at a substantially linear operating point when said mobile terminal is in said digital mode;

operating said transmit amplifier at a substantially non-linear operating point when said mobile terminal is in said analog mode;

configuring an antenna assembly included in said mobile terminal in a half-duplex configuration when said mobile terminal is operating in said digital mode; and configuring said antenna assembly in a full-duplex configuration when said mobile terminal is operating in said analog mode.

2. The method of claim 1 wherein configuring said antenna assembly in a full-duplex configuration comprises connecting a transmit signal output of said transmit amplifier to an antenna through a duplexer, said antenna and said duplexer included in said antenna assembly, and further wherein configuring said antenna assembly in a half-duplex configuration comprises connecting said transmit signal output to said antenna without passing through said duplexer.

3. A method of operating a mobile terminal having at least a digital mode of operation and an analog mode of operation, said method comprising:

operating a transmit amplifier included in said mobile terminal at a substantially linear operating point when said mobile terminal is in said digital mode;

operating said transmit amplifier at a substantially non-linear operating point when said mobile terminal is in said analog mode;

configuring an antenna assembly included in said mobile terminal in a half-duplex configuration when said mobile terminal is operating in said digital mode;

configuring said antenna assembly in a full-duplex configuration when said mobile terminal is operating in said analog mode;

wherein configuring said antenna assembly in a full-duplex configuration comprises connecting a transmit signal output of said transmit amplifier to an antenna through a duplexer, said antenna and said duplexer included in said antenna assembly;

wherein configuring said antenna assembly in a half-duplex configuration comprises connecting said transmit signal output to said antenna without passing through said duplexer; and wherein an output power increase from said transmit amplifier associated with said mobile terminal changing from said digital mode to said analog mode is substantially offset by a corresponding power loss associated with connecting said transmit signal output to said antenna through said duplexer, such that said mobile terminal transmits via said antenna with approximately the same power in both digital and analog modes.

4. The method of claim 1 wherein said digital mode corresponds to a first digital mode associated with a first frequency band and wherein said mobile terminal further has at least a second digital mode of operation associated with a second frequency band, said method further comprising:

selecting an alternate transmit amplifier included in said mobile terminal when said mobile terminal is operating in said second digital mode;

selecting an alternate half-duplex configuration included in said antenna assembly when said mobile terminal is in said second digital mode;

transmitting, by said mobile terminal, digital communications signals on said second frequency band in said second digital mode.

5. The method of claim 4 wherein said antenna assembly includes a switch arrangement operative to selectively enable said alternate half-duplex configuration and simultaneously disable said full duplex configuration.

6. A method of operating a mobile terminal, said method comprising:
providing a transmitter in said mobile terminal having a power amplifier operable in a first substantially linear mode and a second substantially non-linear mode;
transmitting, via an antenna assembly included in said mobile terminal, digital communications signals from said transmitter by operating said power amplifier in said first mode;
transmitting, via said antenna assembly, analog communications signals from said transmitter by operating said power amplifier in said second mode;
configuring said antenna assembly such that said analog communications signals pass through a duplexer included in said antenna assembly; and
configuring said antenna assembly such that said digital communications signals bypass said duplexer.

7. The method of claim 6 wherein said antenna assembly further comprises a switch disposed between said transmitter and said duplexer, said switch operable in a first state to engage said duplexer and a second state to bypass said duplexer, and further including setting said switch to said first state when transmitting said analog communications signals and setting said switch to said second state when transmitting said digital communications signals.

8. The method of claim 6 wherein said power amplifier comprises a variable gain power amplifier and further comprising setting, by a controller, a gain of said variable gain power amplifier to control said first and second modes of operation.

9. The method of claim 6 wherein said transmitter further comprises a variable gain preamplifier providing a variable gain input signal to said power amplifier and further comprising varying, by a controller, a gain of said variable gain preamplifier to control said first and second modes of operation.

10. The method of claim 6 wherein transmitting said digital communications signals comprises transmitting said digital communications signals in a first frequency band and wherein transmitting said analog communications signals comprises transmitting said analog communications signals in said first frequency band.

11. The method of claim 10 wherein said first mode corresponds to a first digital mode associated with said first frequency band and wherein said mobile terminal further has at least a third mode of operation, and wherein said mobile terminal further comprises alternate band receiver and transmitter elements, and wherein said antenna assembly further comprises an alternate band receive and transmit signal path, and further comprising transmitting digital communications signals on said frequency band via said alternate band receiver and transmitter elements and said alternate band receive and transmit signal path in said third mode.

12. A mobile terminal having at least an analog node of operation and a digital mode of operation, comprising:
a transmitter comprising an amplifier operating at a first operating point with substantially linear transmit signal amplification when said mobile terminal is in said digital mode and operating at a second operating point with substantially non-linear transmit signal amplification when said mobile terminal is in said analog mode;
an antenna assembly selectively providing a first receive/transmit circuit path and a second receive/transmit circuit path; and
a controller that controls said amplifier to operate at said first operating point and selects said first receive/transmit circuit path when said mobile terminal is in said digital mode, said controller further controls said amplifier to operate at said second operating point and selects said second receive/transmit circuit path when said mobile terminal is in said analog mode.

13. The mobile terminal of claim 12 further comprising a switch arrangement in said antenna assembly operable to select between said first and second receive/transmit circuit paths under the direction of said controller.

14. The mobile terminal of claim 13 wherein said controller provides a switch control output for controlling said switch arrangement.

15. The mobile terminal of claim 12 wherein said antenna assembly comprises a duplexer, said duplexer forming a portion of said first receive/transmit circuit path such that a transmit signal from said transmitter passes through said duplexer in said analog mode, said antenna assembly further comprising a switch operable to bypass said duplexer such that said transmit signal from said transmitter does not pass through said duplexer in said digital mode.

16. A mobile terminal comprising:
a transmitter including a power amplifier providing substantially linear amplification of a transmit signal when operating in a first mode and providing substantially non-linear amplification of said transmit signal when operating in a second mode;
an antenna assembly selectively providing first and second transmit signal paths for said transmit signal and comprising at least one antenna;
a controller that controls the selection of said first and second modes for said power amplifier and selects between said first and second transmit signal paths;
wherein said controller controls said power amplifier to operate in said first mode and selects said first transmit signal path when said mobile terminal operates in a digital communications mode;
wherein said controller controls said power amplifier to operate in said second mode and selects said second transmit signal path when said mobile terminal operates in an analog communications mode;
wherein said second transmit signal path includes a duplexer such that said transmit signal from said transmitter passes through said duplexer before being broadcast from said at least one antenna; and
wherein said first transmit path bypasses said duplexer such that said transmit signal from said transmitter does not pass through said duplexer before being broadcast from said at least one antenna.

17. A mobile terminal comprising:
a transmitter including a power amplifier providing substantially linear amplification of a transmit signal when operating in a first mode and providing substantially non-linear amplification of said transmit signal when operating in a second mode;
an antenna assembly selectively providing first and second transmit signal paths for said transmit signal and comprising at least one antenna;
a controller that controls the selection of said first and second modes for said power amplifier and selects between said first and second transmit signal paths;
an alternate band transmitter in communication with said controller;
wherein said antenna assembly further comprises a selectable alternate band transmit signal path; and
wherein said controller selects between said first transmit signal path, said second transmit signal path, and said alternate band transmit signal path.

18. The mobile terminal of claim 17 wherein said antenna assembly further comprises a switch arrangement in communication with said controller operable to select between said first, second, and alternate band transmit signal paths.

19. The mobile terminal of claim 18 wherein said controller controls said switch arrangement to select said alternate band transmit signal path when transmitting on an alternate frequency band and selects said alternate band receive signal path when receiving on said alternate frequency band.

* * * * *